United States Patent
Tang et al.

(10) Patent No.: US 11,899,742 B2
(45) Date of Patent: Feb. 13, 2024

(54) QUANTIZATION METHOD BASED ON HARDWARE OF IN-MEMORY COMPUTING

(71) Applicant: NATIONAL TSING HUA UNIVERSITY, Hsinchu (TW)

(72) Inventors: Kea-Tiong Tang, Taipei (TW); Wei-Chen Wei, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 596 days.

(21) Appl. No.: 16/923,074

(22) Filed: Jul. 7, 2020

(65) Prior Publication Data

US 2021/0294874 A1     Sep. 23, 2021

(30) Foreign Application Priority Data

Mar. 20, 2020 (TW) ................ 109109478

(51) Int. Cl.
*G06F 17/15* (2006.01)

(52) U.S. Cl.
CPC ............ *G06F 17/15* (2013.01); *G06F 17/153* (2013.01)

(58) Field of Classification Search
CPC ........ G06F 17/15; G06F 17/153; G06F 17/16; G06F 7/5443; G06F 7/4991; G06F 7/49921; G06N 3/02–088
See application file for complete search history.

(56) References Cited

U.S. PATENT DOCUMENTS

| | | |
|---|---|---|
| 9,646,243 B1 | 5/2017 | Gokmen |
| 2017/0286830 A1 | 10/2017 | El-Yaniv et al. |

(Continued)

FOREIGN PATENT DOCUMENTS

| | | |
|---|---|---|
| TW | 201928793 A | 7/2019 |
| TW | 201937410 A | 9/2019 |

(Continued)

OTHER PUBLICATIONS

Sheng et al. "A Quantization-Friendly Separable Convolution for MobileNets", Mar. 2019, https://doi.org/10.48550/arXiv.1803.08607 (Year: 2019).*

(Continued)

*Primary Examiner* — Emily E Larocque
*Assistant Examiner* — Carlo Waje
(74) *Attorney, Agent, or Firm* — CKC & Partners Co., LLC (57) ABSTRACT

A quantization parameter providing step of a quantization method is performed to provide a quantization parameter which includes a quantized input activation, a quantized weight and a splitting value. A parameter splitting step is performed to split the quantized weight and the quantized input activation into a plurality of grouped quantized weights and a plurality of grouped activations, respectively, according to the splitting value. A multiply-accumulate step is performed to execute a multiply-accumulate operation with one of the grouped quantized weights and one of the grouped activations, and then generate a convolution output. A convolution quantization step is performed to quantize the convolution output to a quantized convolution output according to a convolution target bit. A convolution merging step is performed to execute a partial-sum operation with the quantized convolution output according to the splitting value, and then generate an output activation.

2 Claims, 8 Drawing Sheets

(56) References Cited

U.S. PATENT DOCUMENTS

2020/0234112 A1* 7/2020 Wang .................. G06N 3/08
2021/0064920 A1* 3/2021 Ahn .................. G06N 3/0454

FOREIGN PATENT DOCUMENTS

TW        201937412 A    9/2019
WO    2017214728 A1  12/2017

OTHER PUBLICATIONS

Zhuan et al. "Towards Effective Low-bitwidth Convolutional Neural Networks", Nov. 2017, https://doi.org/10.48550/arXiv.1711.00205 (Year: 2017).*

Louizos et al. "Relaxed Quantization for Discretized Neural Networks", Otc. 2018, https://doi.org/10.48550/arXiv.1810.01875 (Year: 2018).*

Hennessy et al., "Computer Organization and Design: The Hardware/Software Interface", Fifth Edition, Chapter 2 pp. 62-174, 2014. Retrieved from <https://ict.iitk.ac.in/wp-content/uploads/CS422-Computer-Architecture-ComputerOrganizationAndDesign5thEdition2014.pdf> (Year: 2014).*

W.- C. Wei et al., "A Relaxed Quantization Training Method for Hardware Limitations of Resistive Random Access Memory (ReRAM)-Based Computing-in-Memory," in IEEE Journal on Exploratory Solid-State Computational Devices and Circuits, vol. 6, No. 1, pp. 45-52, Jun. 2020, doi: 10.1109/JXCDC.2020.2992306. (Year: 2020).*

* cited by examiner

QUANTIZATION METHOD BASED ON HARDWARE OF IN-MEMORY COMPUTING

RELATED APPLICATIONS

This application claims priority to Taiwan Application Serial Number 109109478, filed Mar. 20, 2020, which is herein incorporated by reference.

BACKGROUND

Technical Field

The present disclosure relates to a quantization method and a system thereof. More particularly, the present disclosure relates to a quantization method based on a hardware of in-memory computing and a system thereof.

Description of Related Art

In the prior art, a model quantization algorithm focuses on the precision of inputs and weights in the neural network, and realize the compact neural network on digital devices. In recent years, the energy efficiency of in-memory computing has been proven better than a conventional digital circuit. However, when the conventional model quantization method is applied to in-memory computing, the weights obtained by training a neural network cannot effectively improve accuracy. Therefore, a quantization method based on a hardware of in-memory computing and a system thereof having the features of effectively improving accuracy are commercially desirable.

SUMMARY

According to one aspect of the present disclosure, a quantization method based on a hardware of in-memory computing includes a quantization parameter providing step, a parameter splitting step, a multiply-accumulate step, a convolution quantization step and a convolution merging step. The quantization parameter providing step is performed to provide a quantization parameter. The quantization parameter includes a quantized input activation, a quantized weight and a splitting value. The parameter splitting step is performed to split the quantized weight and the quantized input activation into a plurality of grouped quantized weights and a plurality of grouped activations, respectively, according to the splitting value. The multiply-accumulate step is performed to execute a multiply-accumulate operation with one of the grouped quantized weights and one of the grouped activations, and then generate a convolution output. The convolution quantization step is performed to quantize the convolution output to a quantized convolution output according to a convolution target bit. The convolution merging step is performed to execute a partial-sum operation with the quantized convolution output according to the splitting value, and then generate an output activation.

According to another aspect of the present disclosure, a quantization system based on a hardware of in-memory computing includes a parameter splitting module, a multiply-accumulate unit, a convolution quantizer and an adder. The parameter splitting module is configured to split a quantized weight and a quantized input activation into a plurality of grouped quantized weights and a plurality of grouped activations, respectively, according to a splitting value. The multiply-accumulate unit is signally connected to the parameter splitting module. The multiply-accumulate unit is configured to execute a multiply-accumulate operation with one of the grouped quantized weights and one of the grouped activations so as to generate a convolution output. The convolution quantizer is signally connected to the multiply-accumulate unit. The convolution quantizer is configured to quantize the convolution output to a quantized convolution output according to a convolution target bit. The adder is signally connected to the convolution quantizer. The adder is configured to execute a partial-sum operation with the quantized convolution output according to the splitting value so as to generate an output activation.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

The present disclosure includes the quantization of a plurality of weights and a plurality of activations of a neural network. The motivation for the quantization of the weights of the neural network is to reduce the size of the model and accelerate the calculation during training and inference. As far as a hardware is concerned, the quantization of the weights of the present disclosure can reduce memory utilization and conserve computing resources to execute highly accurate artificial intelligence (AI) application. In addition, the motivation for the quantization of the activations of the neural network is to utilize binary operations to replace inner product operations and reduce the inter-layer data. As far as the hardware is concerned, the quantization of the activations of the present disclosure can not only improve memory utilization but also reduce the bandwidth and latency required in the system.

Figure 1:
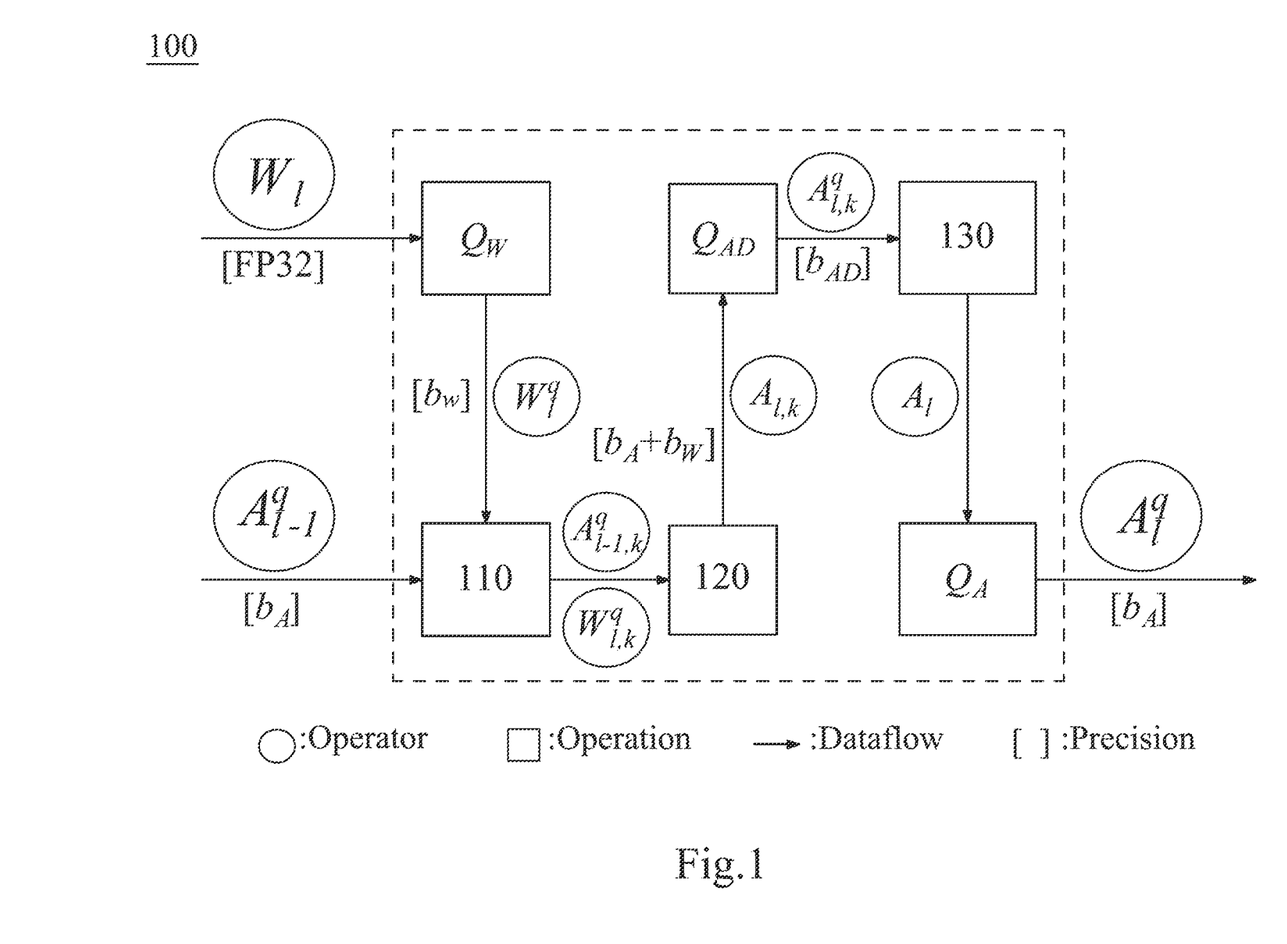
FIG. 1 shows a schematic view of a quantization system based on a hardware of in-memory computing according to a first embodiment of the present disclosure.
Figure 2:
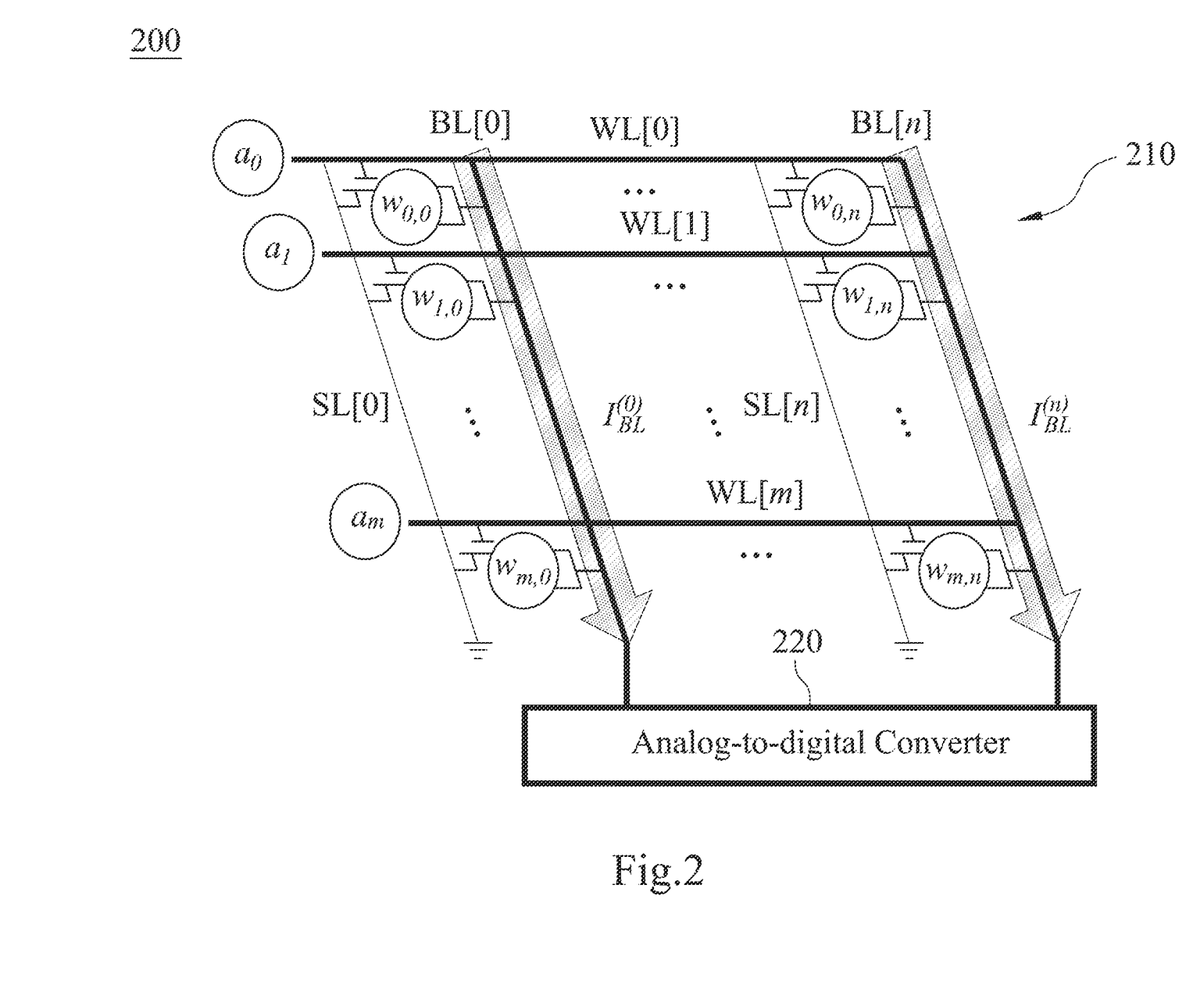
FIG. 2 shows a schematic view of a hardware of in-memory computing according to a second embodiment of the present disclosure.
Figure 3:
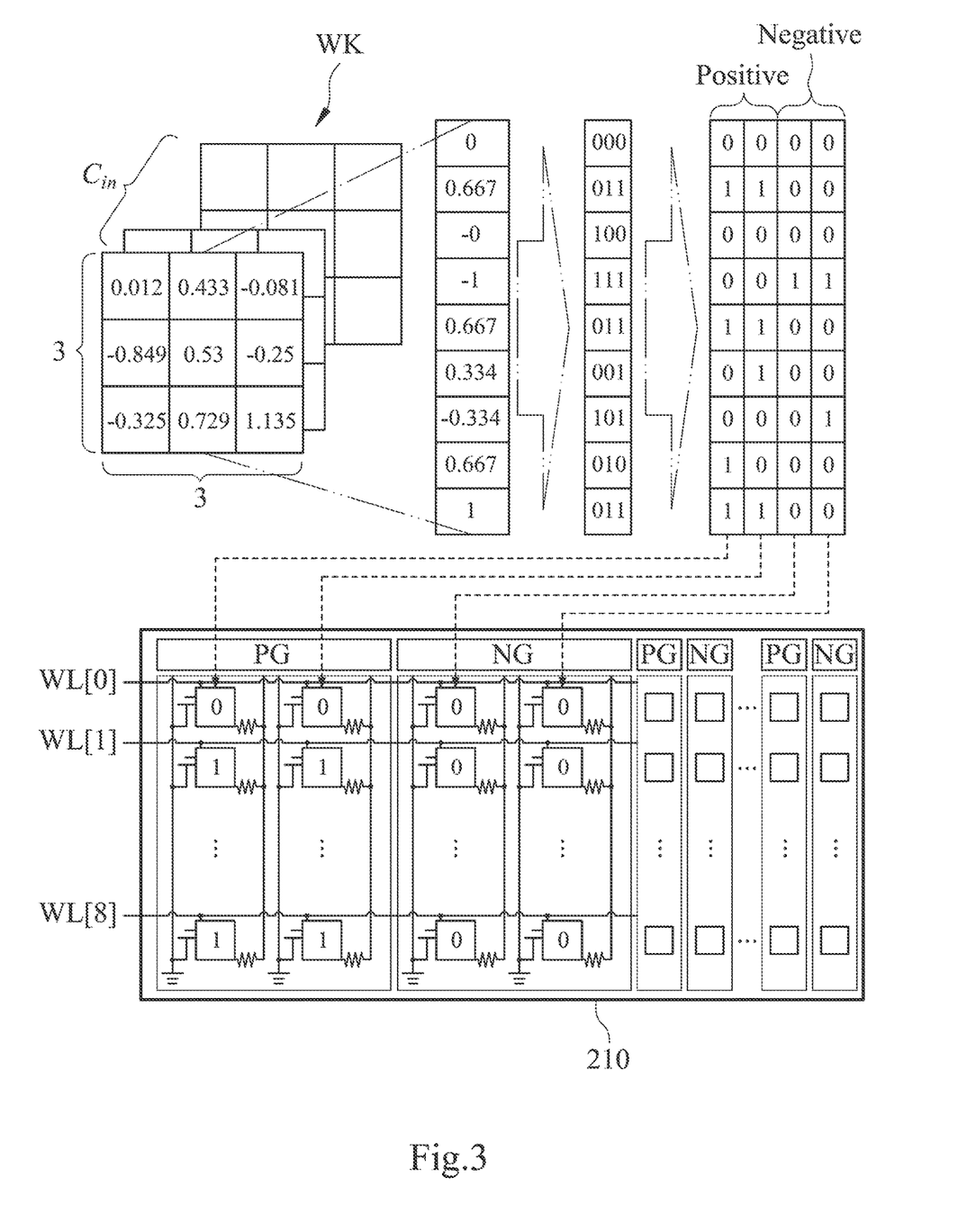
FIG. 3 shows a schematic view of a weight kernel of a parameter splitting module of FIG. 1 corresponding to the hardware of in-memory computing of FIG. 2.
Figure 4:
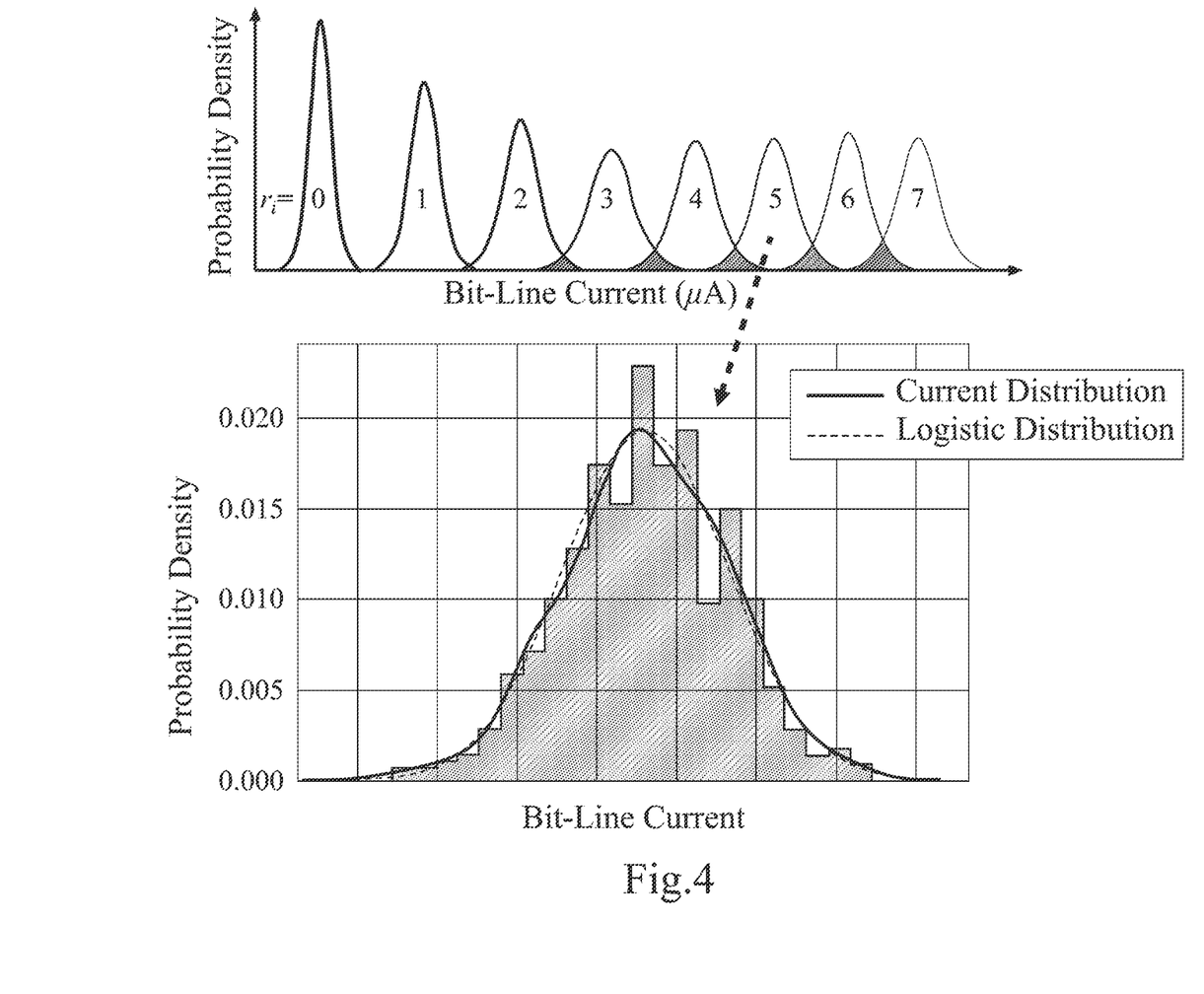
FIG. 4 shows a schematic view of a distribution of a convolution output of a multiply-accumulate unit of FIG. 1, which is corresponding to a distribution of a cumulative current on a bit line.
Figure 5:
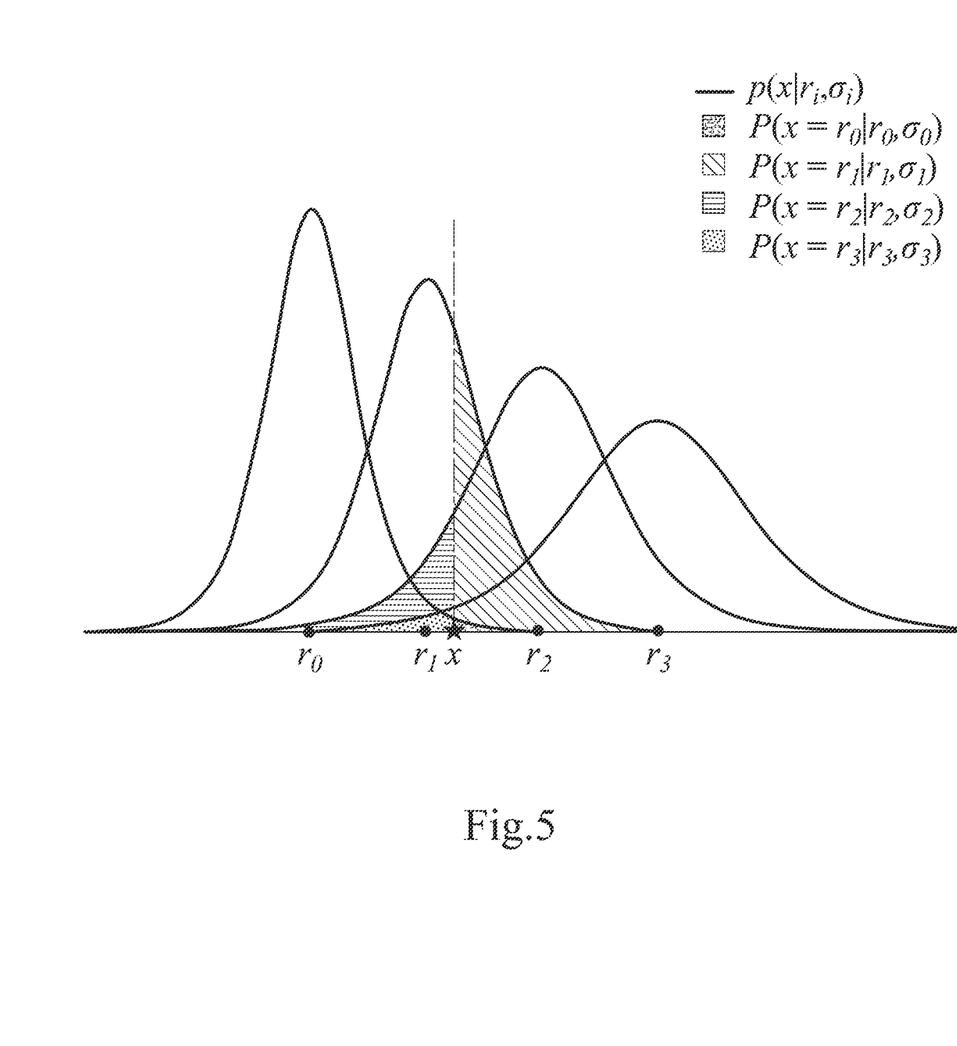
FIG. 5 shows a schematic view of a categorical distribution of an analog-to-digital convertor of the hardware of in-memory computing of FIG. 2.
Figure 6:
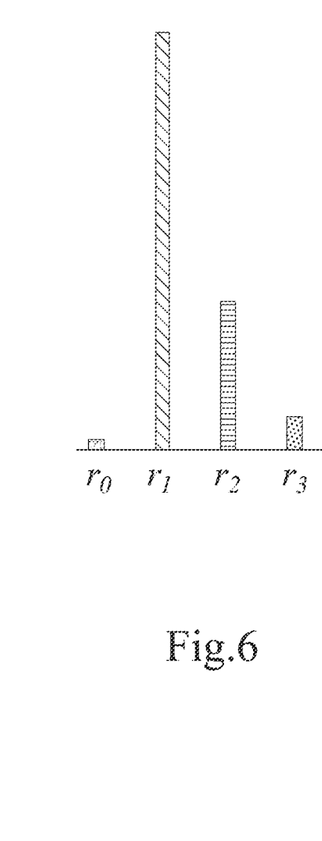
FIG. 6 shows a schematic view of a categorical probability of each of bit-line currents of FIG. 5.

Please refer to FIGS. 1-6. FIG. 1 shows a schematic view of a quantization system 100 based on a hardware 200 of in-memory computing according to a first embodiment of the present disclosure. FIG. 2 shows a schematic view of a hardware 200 of in-memory computing according to a second embodiment of the present disclosure. FIG. 3 shows a schematic view of a weight kernel WK of a parameter splitting module 110 of FIG. 1 corresponding to the hardware 200 of in-memory computing of FIG. 2. FIG. 4 shows a schematic view of a distribution of a convolution output $A_{l,k}$ of a multiply-accumulate unit 120 of FIG. 1, which is corresponding to a distribution of a cumulative current on a bit line (i.e., one of BL[0]-BL[n] in FIG. 2). FIG. 5 shows a schematic view of a categorical distribution $p(\tilde{r}_i)$ of an analog-to-digital convertor 220 (ADC) of the hardware 200 of in-memory computing of FIG. 2. FIG. 6 shows a schematic view of a categorical probability of each of bit-line currents $r_i$ of FIG. 5. The quantization system 100 based on the hardware 200 of in-memory computing includes a weight quantizer $Q_W$, a parameter splitting module 110, a multiply-accumulate unit 120, a convolution quantizer $Q_{AD}$, an adder 130 and an activation quantizer $Q_A$.

The weight quantizer $Q_W$ is configured to convert a weight $W_l$ into the quantized weight $W_l^q$ according to a weight target bit $b_W$. The weight quantizer $Q_W$ includes the weight target bit $b_W$, the weight $W_l$, a mapped quantized weight $\overline{W}_l$, a quantization equation quan and the quantized weight $W_l^q$. The weight quantizer $Q_W$ is described as follows:

$$\overline{W}_l = \frac{\tanh(W_l)}{\max(|\tanh(W_l)|)}; \quad (1)$$

$$W_l^q = Q_W(\overline{W}_l, b_W) = quan(\overline{W}_l, b_W - 1) = \frac{\lfloor \overline{W}_l \cdot (2^{b_W-1} - 1) \rfloor}{(2^{b_W-1} - 1)}. \quad (2)$$

The weight $W_l$ is a 32-bit floating-point value (FP32), and the quantized weight $W_l^q$ is a digital value having the weight target bit $b_W$.

The parameter splitting module 110 is signally connected to the weight quantizer $Q_W$ and receives the quantized weight $W_l^q$. The parameter splitting module 110 is configured to split the quantized weight $W_l^q$ and a quantized input activation $A_{l-1}^q$ into a plurality of grouped quantized weights $W_{l,k}^q$ and a plurality of grouped activations $A_{l-1,k}^q$, respectively, according to a splitting value K. In detail, the quantized input activation $A_{l-1}^q$ has a number of a plurality of input channels $C_{in}$. The splitting value K is obtained by calculating the number of the input channels $C_{in}$ and a control parameter $\tau$. The splitting value K is equal to the number of the input channels $C_{in}$ divided by the control parameter $\tau$. The splitting value K is a positive integer and is greater than 1 and less than or equal to the number of the input channels $C_{in}$. In one embodiment, the splitting value K can be equal to the number of the input channels $C_{in}$, i.e., the control parameter $\tau$ is equal to 1, but the present disclosure is not limited thereto.

The multiply-accumulate unit 120 is signally connected to the parameter splitting module 110. The multiply-accumulate unit 120 is configured to execute a multiply-accumulate operation with one of the grouped quantized weights $W_{l,k}^q$ and one of the grouped activations $A_{l-1,k}^q$ so as to generate the convolution output $A_{l,k}$.

The convolution quantizer $Q_{AD}$ is signally connected to the multiply-accumulate unit 120. The convolution quantizer $Q_{AD}$ is configured to quantize the convolution output $A_{l,k}$ to a quantized convolution output $A_{l,k}^q$ according to a convolution target bit $b_{AD}$. In detail, the convolution quantizer $Q_{AD}$ may be configured to execute a straight-through-estimator-based quantization (STE-based quantization) or a concrete-based quantization. The STE-based quantization includes the convolution output $A_{l,k}$, the convolution target bit $b_{AD}$, a mapped convolution output $\overline{A}_{l,k}$, a quantization equation quan, and the quantized convolution output $A_{l,k}^q$. The STE-based quantization is described as follows:

$$\overline{A}_{l,k} = \min(\max(A_{l,k}, -2^{b_{AD}} + 1), 2^{b_{AD}} - 1); \quad (3)$$

$$\overline{A}_{l,k} = \frac{\overline{A}_{l,k}}{\max(|\overline{A}_{l,k}|)}; \quad (4)$$

$$A_{l,k}^q = quan(\overline{A}_{l,k}, b_{AD}) = \frac{\lfloor \overline{A}_{l,k} \cdot (2^{b_{AD}-1} - 1) \rfloor}{(2^{b_{AD}-1} - 1)}. \quad (5)$$

The concept of the STE-based quantization is to consider a limited number of bits of the analog-to-digital convertor 220 of the hardware 200 of in-memory computing in the quantization process. The convolution output $A_{l,k}$ is limited to a specific value to generate the mapped convolution output $\overline{A}_{l,k}$ according to the number of the bits of the analog-to-digital convertor 220. It is because the current withstood by the analog-to-digital convertor 220 is limited in a nonvolatile in-memory computing (nvIMC), such as $I_{BL}^{(0)}$-$I_{BL}^{(n)}$ of FIG. 2. In the present disclosure, the limitation of the number of the bits of the analog-to-digital convertor 220 is regarded as the limitation of the current withstood by the analog-to-digital convertor 220, so that the convolution output $A_{l,k}$ is limited to the specific value to simulate quantization. Then, the quantized convolution output $A_{l,k}^q$ may be obtained by a linear quantization (e.g., the quantization equation quan).

The concrete-based quantization includes the convolution output $A_{l,k}$, a represent value $R_{AD}$, a scale factor $\alpha$, a bias $\beta$, a digital current value $r_i$, an activation signal a, a sigmoid function sigmoid, a standard deviation $\sigma_i$, a concrete function Concrete, a temperature parameter $\lambda$, a categorical probability $\pi_i$, a random sample $s_i$, the splitting value K, an activation quantization signal $a^q$ and the quantized convolution output $A_{l,k}^q$. The concrete-based quantization is described as follows:

$$r_i = [\widetilde{R_{AD}}] = [\alpha R_{AD} + \beta]; \tag{6}$$

$$\pi_i = \begin{cases} 1 - \text{sigmoid}\left(\frac{(1-r_i)}{\sigma_i}\right) & \text{for } a > r_i \\ \text{sigmoid}\left(\frac{a-r_i}{\sigma_i}\right); & \text{for } a \leq r_i \end{cases}, a \in A_{l,k}; \tag{7}$$

$$s_i = \text{Concrete}(\pi_i, \lambda); \tag{8}$$

$$a^q = \sum_{i=0}^{K-1} s_i r_i, a^q \in A_{l,k}^q. \tag{9}$$

The represent value $R_{AD}$ is equal to $[-2^{b_{AD}-1}+1, \ldots, 0, \ldots, 2^{b_{AD}-1}-1]$. An initial value of the scale factor $\alpha$ is equal to $t+3t/2^{b_{AD}}$, where t is equal to $(\max(A_{l,k})-\min(A_{l,k}))/2^{b_{AD}}$. The bias $\beta$ is equal to 0. The standard deviation $\sigma_i$ is equal to $\alpha/3$. The concrete function includes a noise $n_i$, the temperature parameter $\lambda$, the categorical probability $\pi_i$, the random sample $s_i$, a Gumbel function Gumbel and a softmax function softmax. The concrete function is described as follows:

$$n_i = \text{Gumbel}(0, 1); \tag{10}$$

$$s_i = \text{softmax}\left(\frac{\log \pi_i + n_i}{\lambda}\right). \tag{11}$$

The concrete-based quantization can construct learnable represent values $R_{AD}$ by the scale factor $\alpha$ and the bias $\beta$, and establish probabilistic models for a noise distribution $p(\eta)$ and a categorical distribution $p(\tilde{r}_i)$, where $\tilde{r}_i = r_i + \eta$ and $r_i \in \widetilde{R_{AD}}$. For the noise distribution $p(\eta)$, the noise model assumes that the noise is sampled from a zero-mean logistic distribution (L) with the standard deviation $\sigma_j$; for example, $p(\eta) = L(0, \sigma_i)$, and $p(\tilde{r}_i) = L(r_i, \sigma_i)$, as shown in FIG. 5. For example, when an input signal x falls in the noise model, a tail probability of each categorical distribution $p(\tilde{r}_i)$ in which the input signal x falls may be calculated (i.e., each shaded area of FIG. 5). Then, the tail probability of each categorical distribution $p(\tilde{r}_i)$ based on the input signal x is regarded as the categorical probability of the input signal x relative to the digital current value $r_i$, as shown in FIG. 6. In a deep neural network, the categorical probability of the activation signal a of each convolution quantizer $Q_{AD}$ is described as follows:

$$p(a = \tilde{r}_i | r_i, \sigma_i) = \begin{cases} 1 - P(a \leq r_i); & \text{for } a > r_i \\ P(a \leq r_i); & \text{for } a \leq r_i \end{cases}; \tag{12}$$

$$p(a = \tilde{r}_i | r_i, \sigma_i) = \begin{cases} 1 - \text{sigmoid}\left(\frac{a-r_i}{\sigma_i}\right); & \text{for } a > r_i \\ \text{sigmoid}\left(\frac{a-r_i}{\sigma_i}\right); & \text{for } a \leq r_i \end{cases}. \tag{13}$$

Wherein P represents a cumulative distribution function (CDF). The CDF of the logistic distribution is the sigmoid function sigmoid. The assumption of the logistic distribution has two advantages. A first advantage is that the logistic distribution is very similar to a normal distribution and also satisfies a current distribution of the bit line. A second advantage is that the sigmoid function sigmoid can perform a partial differential operation in the backpropagation of training instead of generating a virtual gradient, thereby solving the problem of gradient mismatch. Therefore, the concept of the concrete-based quantization is to establish probabilistic models for the noise distribution of the analog-to-digital convertor 220 and normalize the categorical probability $\pi_i$. The establishment of the categorical probability $\pi_i$ can not only estimate quantization noise of the analog-to-digital convertor 220, but also prevent the deep neural network from overfitting.

The adder 130 is signally connected to the convolution quantizer $Q_{AD}$. The adder 130 is configured to execute a partial-sum operation with the quantized convolution output $A_{l,k}^q$ according to the splitting value K so as to generate an output activation $A_l$.

The activation quantizer $Q_A$ is signally connected to the adder 130. The activation quantizer $Q_A$ is configured to quantize the output activation $A_l$ into a quantized output activation $A_l^q$ according to an activation target bit $b_A$. The activation quantizer $Q_A$ includes the output activation $A_l$, a clipping function Clip, a mapped activation $\overline{A}_l$, the activation target bit $b_A$, a quantization equation quan and the quantized output activation $A_l^q$. The activation quantizer $Q_A$ is described as follows:

$$\overline{A}_l = \text{Clip}(A_l) = \min(\max(0, A_l), 1); \tag{14}$$

$$A_l^q = Q_A(\overline{A}_l) = quan(\overline{A}_l, b_A) = \frac{\lfloor \overline{A}_l \cdot (2^{b_A-1}-1) \rfloor}{(2^{b_A-1}-1)}. \tag{15}$$

The multiply-accumulate unit 120, the convolution quantizer $Q_{AD}$ and the adder 130 are configured to repeatedly execute a multiply-accumulate step S06, a convolution quantization step S08 and a convolution merging step S10 (shown in FIG. 7), respectively, according to an iteration number. The iteration number is equal to the splitting value K. Accordingly, the grouped quantized weights $W_{l,k}^q$ and the grouped activations $A_{l-1,k}^q$ can be pairwise calculated to accomplish a convolution operation.

Therefore, the quantization system 100 based on the hardware 200 of in-memory computing of the present disclosure can consider the limitation of the number of the bits of the analog-to-digital convertor 220 of the hardware 200. In addition, the quantization system 100 of the present disclosure may train the deep neural network by the categorical distribution $p(\tilde{r}_i)$ and the concrete-based quantization, and the deep neural network can not only be adapted to quantization noise but also be friendly to in-memory computing.

The hardware 200 of in-memory computing includes a memory unit 210 and an analog-to-digital converter 220. The memory unit 210 is signally connected to the analog-to-digital converter 220. The memory unit 210 includes a plurality of memory cells, a plurality of word lines (e.g., WL[0]-WL[m] of FIG. 2 and WL[0]-WL[8] of FIG. 3), a plurality of bit lines (e.g., BL[0]-BL[n] of FIG. 2, a positive-weight group (PG) and a negative-weight group (NG) of FIG. 3) and a plurality of source lines (e.g., SL[0]-SL[n] of FIG. 2). Each of the memory cells is connected to one of the word lines, one of the bit lines and one of the source lines. Each of the memory cells stores the weight (e.g., one of $w_{0,0}$-$w_{m,n}$ of FIG. 2). Each of the word lines transmits the activation signal a (e.g., one of $a_0$-$a_m$ of FIG. 2). Each of the bit lines transmits the convolution output $A_{l,k}$ (e.g., the currents $I_{BL}^{(0)}$-$I_{BL}^{(n)}$ of FIG. 2). Each of the source lines is connected to a ground. In one embodiment, the memory unit 210 may be a resistive random access memory (ReRAM), but the present disclosure is not limited thereto.

For example, in FIG. 3, assuming that the size of an input feature map is $H \times W \times C_{in}$, and the size of the weight kernel WK is $3 \times 3 \times C_{in} \times C_{out}$ (FIG. 3 only shows a part of the weight kernel WK). The convolution operation is performed to obtain an output feature map having the size of $H \times W \times C_{out}$. H and W represent the length and the width of the input feature map, respectively. $C_{in}$ represents the number of the input channels. $C_{out}$ represents the number of output channels. The number of the word lines is equal to 9 (i.e., WL[0]-WL[8]). The convolution operation of nvIMC includes a plurality of processes. First, a part of the input feature map having the size of $3 \times 3 \times 1$ is correspondingly transmitted to the word lines. The part of the input feature map and the grouped quantized weights $W_{l,k}^q$ on the bit lines (nine quantized weight values) are calculated. The number of the bit lines is $C_{out}$. Second, after a cycle, nvIMC outputs a plurality of matrix-vector multiplication (MVM) output values. The number of the MVM output values is $C_{out}$. After $C_{in}$ cycles, $C_{in} \times C_{out}$ MVM output values are generated. Third, the MVM output values are merged to obtain the output feature map having the size of $1 \times 1 \times C_{out}$. Fourth, the convolution operation of one convolutional layer is accomplished to obtain the output feature map having the size of $H \times W \times C_{out}$ by replacing the part of the input feature map of the word lines. Therefore, nvIMC of the present disclosure can pre-store the grouped quantized weights $W_{l,k}^q$ to the memory unit 210 and utilize the hardware 200 of in-memory computing to implement the convolution operation, thereby avoiding the problem of a large amount of data transfer between hierarchical memories in a conventional structure. The present disclosure can further reduce power consumption, decrease system latency and improve power efficiency. In addition, the present disclosure utilizes a splitting technique and pairwise calculation on the quantized weight $W_l^q$ and the quantized input activation $A_{l-1}^q$ via the convolution operation of ReRAM and considers the limitation of the number of the bit lines of the memory unit 210, inputs of the word lines and discretization of the convolution output $A_{l,k}$, so that the present disclosure can obtain better updated weights suitable for the hardware limitations of nvIMC by training the deep neural network.

Figure 7:
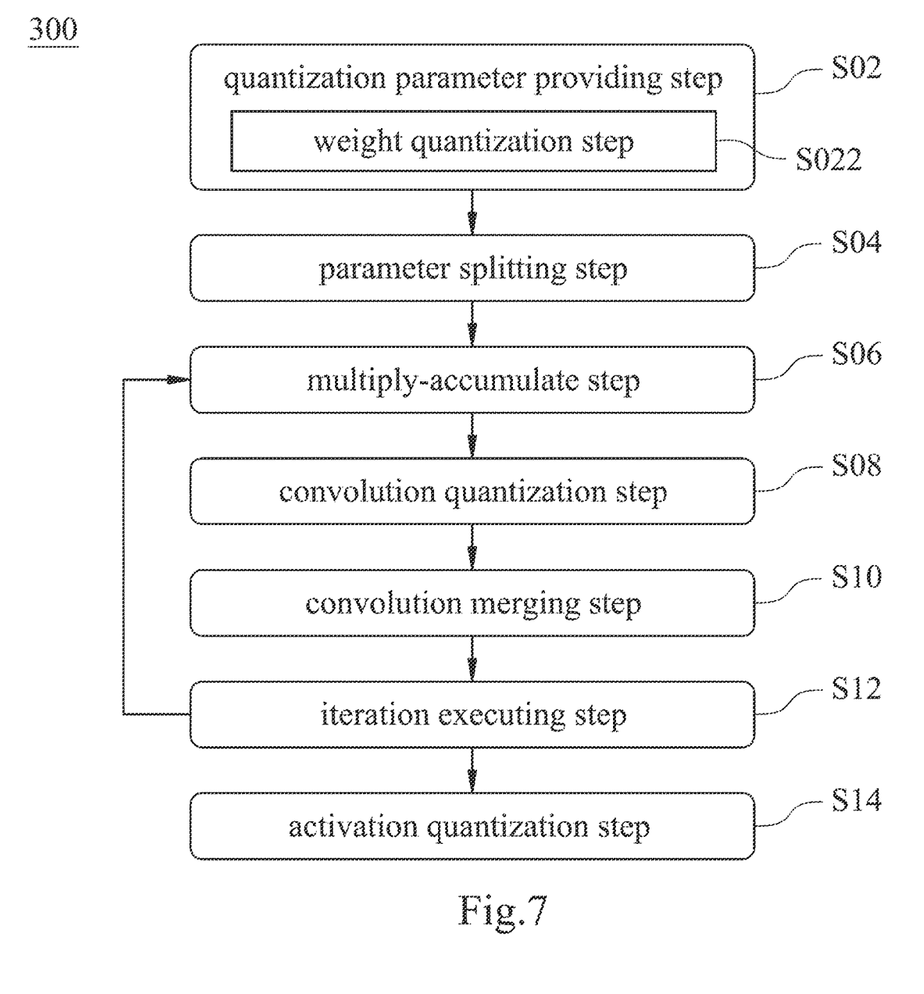
FIG. 7 shows a flow chart of a quantization method based on a hardware of in-memory computing according to a third embodiment of the present disclosure.

Please refer to FIGS. 1-7. FIG. 7 shows a flow chart of a quantization method 300 based on a hardware 200 of in-memory computing according to a third embodiment of the present disclosure. The quantization method 300 based on the hardware 200 of in-memory computing includes a quantization parameter providing step S02, a parameter splitting step S04, a multiply-accumulate step S06, a convolution quantization step S08, a convolution merging step S10, an iteration executing step S12 and an activation quantization step S14.

The quantization parameter providing step S02 is performed to provide a quantization parameter, and the quantization parameter includes a quantized input activation $A_{l-1}^q$, a quantized weight $W_l^q$ and a splitting value K. In detail, the quantized input activation $A_{l-1}^q$ has a number of a plurality of input channels $C_{in}$. The splitting value K is obtained by calculating the number of the input channels $C_{in}$ and a control parameter $\tau$. The splitting value K is equal to the number of the input channels $C_{in}$ divided by the control parameter $\tau$. The splitting value K is a positive integer and is greater than 1 and less than or equal to the number of the input channels $C_{in}$. Moreover, the quantization parameter providing step S02 includes a weight quantization step S022. The weight quantization step S022 is performed to convert a weight $W_l$ into the quantized weight $W_l^q$ according to a weight target bit $b_W$. The weight quantization step S022 includes the weight target bit $b_W$, the weight $W_l$, a mapped quantized weight $\overline{W}_l^q$ a quantization equation quan and the quantized weight $W_l^q$. The quantized weight $W_l^q$ is described by the aforementioned equations (1) and (2).

The parameter splitting step S04 is performed to split the quantized weight $W_l^q$ and the quantized input activation $A_{l-1}^q$ into a plurality of grouped quantized weights $W_{l,k}^q$ k and a plurality of grouped activations $A_{l-1,k}^q$, respectively, according to the splitting value K.

The multiply-accumulate step S06 is performed to execute a multiply-accumulate operation with one of the grouped quantized weights $W_{l,k}^q$ and one of the grouped activations $A_{l-1,k}^q$, and then generate a convolution output $A_{l,k}$.

The convolution quantization step S08 is performed to quantize the convolution output $A_{l,k}$ to a quantized convolution output $A_{l,k}^q$ according to a convolution target bit $b_{AD}$. In detail, the convolution quantization step S08 includes performing a STE-based quantization or a concrete-based quantization. The STE-based quantization includes the convolution output $A_{l,k}$, the convolution target bit $b_{AD}$, a mapped convolution output $\overline{A}_{l,k}^q$, a quantization equation quan, and the quantized convolution output $A_{l,k}^q$. The STE-based quantization is described by the aforementioned equations (3)-(5). The concrete-based quantization includes the convolution output $A_{l,k}$, a represent value $R_{AD}$, a scale factor $\alpha$, a bias $\beta$, a digital current value $r_i$, an activation signal a, a sigmoid function sigmoid, a standard deviation $\sigma_i$, a concrete function Concrete, a temperature parameter $\lambda$, a categorical probability $\pi_i$, a random sample $s_i$, the splitting value K, an activation quantization signal $a^q$ and the quantized convolution output $A_{l,k}^q$. The concrete-based quantization is described by the aforementioned equations (6)-(9). In addition, the concrete function includes a noise $n_i$, the temperature parameter $\lambda$, the categorical probability $\pi_i$, the random sample $s_i$, a Gumbel function Gumbel and a softmax function softmax. The concrete function is described by the aforementioned equations (10)-(11).

The convolution merging step S10 is performed to execute a partial-sum operation with the quantized convolution output $A_{l,k}^q$ according to the splitting value K, and then generate an output activation $A_l$.

The iteration executing step S12 is performed to repeatedly execute the multiply-accumulate step S06, the convolution quantization step S08 and the convolution merging step S10 according to an iteration number. The iteration number is equal to the splitting value K.

The activation quantization step S14 is performed to quantize the output activation $A_l$ into a quantized output activation $A_l^q$ according to an activation target bit $b_A$. The activation quantization step S14 includes the output activation $A_l$, a clipping function Clip, a mapped activation $\overline{A}_l$, the activation target bit $b_A$, a quantization equation quan and the quantized output activation $A_l^q$. The quantized output activation $A_l^q$ is described by the aforementioned equations (14)-(15).

The quantization method 300 can be described in Table 1. Table 1 lists the quantization method 300 of the present disclosure for training a neural network. The quantized input activation $A_{l-1}^q$, the weight $W_l$ and the MVM output values (i.e., the convolution output $A_{l,k}$) of the neural network are quantized into $b_A$, $b_W$, and $b_{AD}$ bits, respectively. The present disclosure considers the limitation of the number of the word lines of in-memory computing. The control parameter τ is used to execute the partial-sum operation. k and l are variable parameters.

TABLE 1

1:    for l = 1 to L do
2:      $W_l^q \leftarrow Q_W(W_l, b_W)$    // Weight quantization step
3:      $K \leftarrow \dfrac{\text{input channel of } W_l^q, A_{l-1}^q}{\tau}$
4:      $W_{l,k}^q, A_{l-1,k}^q \leftarrow \text{split}(W_l^q, K), \text{split}(A_{l-1}^q, K)$    // Parameter splitting step
5:      for k = 1 to K in $W_{l,k}^q, A_{l-1,k}^q$ and set $A_l = 0$ do
6:        $A_{l,k} \leftarrow \text{MAC}(A_{l-1,k}^q, W_{l,k}^q)$    // Multiply-accumulate step
7:        $A_{l,k}^q \leftarrow Q_{AD}(A_{l,k}, b_{AD})$    // Convolution quantization step
8:        $A_l \leftarrow A_l + A_{l,k}^q$    // Convolution merging step
9:      end for
10:     $A_l^q \leftarrow Q_A(A_l, b_A)$    // Activation quantization step
11:     optionally apply pooling
12:   end for
13:    $g_{A_L} \leftarrow STE\left(\dfrac{\partial C}{\partial A_L^q}, W_l^q\right)$ //

Backward propagation except that gradients are computed by STE
14:    $W^{updated} \leftarrow \text{UpdateParameters}(W, g_{l_L}, \eta)$    // Weight update rule (e.g., SGD or ADAM)

Lines 1-12 of Table 1 represent a quantization process of an L-layers deep neural network during inference. Lines 13 and 14 of Table 1 represent a backpropagation and a weight update rule of the neural network, respectively. "SGD" represents a stochastic gradient descent method, and "ADAM" represents an adaptive moment estimation. The backpropagation and the weight update rule are conventional technologies and not described in detail herein.

In detail, lines 1-12 of Table 1 represent the quantization process from the first layer (l=1) to the L-th layer, and each layer performs the operations from Line 2 to Line 11.

Line 2 of Table 1 represents that the weight $W_l$ with the floating-point value is linearly quantized into the weight target bit $b_W$ so as to obtain the quantized weight $W_l^q$.

Line 3 of Table 1 represents that the splitting value K of the convolution operation of ReRAM of the current layer is obtained by calculating the control parameter τ, and the number of the input channels $C_{in}$ of the quantized weight $W_l^q$ and the quantized input activation $A_{l-1}^q$. In deep learning, each of the quantized weight $W_l^q$ and the quantized input activation $A_{l-1}^q$ is a four-dimensional tensor during training. The four-dimensional tensor of the quantized weight $W_l^q$ includes a kernel length, a kernel width, the number of the input channels $C_{in}$ and the number of output channels $C_{out}$. The four-dimensional tensor of the quantized input activation $A_{l-1}^q$ includes a batch size, the length H of the input feature map, the width W of the input feature map and the number of the input channels $C_{in}$.

Lines 4-9 of Table 1 represent how to perform the convolution operation of ReRAM via iterative operations and simulate the limitation of the number of the word lines of the hardware 200 of in-memory computing and the conversion of the analog-to-digital converter 220.

Line 4 of Table 1 represents that the quantized weight $W_l^q$ and the quantized input activation $A_{l-1}^q$ are split according to the splitting value K of Line 3. The four-dimensional tensor is changed to a five-dimensional tensor. In other words, the four-dimensional tensor of the quantized weight $W_l^q$ (i.e., the kernel length, the kernel width, the number of the input channels $C_{in}$ and the number of output channels $C_{out}$) are changed to the five-dimensional tensor of the quantized weight $W_l^q$ by splitting the number of the input channels $C_{in}$. The five-dimensional tensor of the quantized weight $W_l^q$ includes the kernel length, the kernel width, the control parameter τ, the number of output channels $C_{out}$ and the splitting value K. The four-dimensional tensor of the quantized input activation $A_{l-1}^q$ (i.e., the batch size, the length H of the input feature map, the width W of the input feature map and the number of the input channels $C_{in}$) are changed to the five-dimensional tensor of the quantized input activation $A_{l-1}^q$. The five-dimensional tensor of the quantized input activation $A_{l-1}^q$ includes the batch size, the length H of the input feature map, the width W of the input feature map, the control parameter τ and the splitting value K. Therefore, the split weights and split tensors having K groups in the fifth dimension can be obtained. In other words, the number of turn-on word lines (WL) can be determined by the control parameter τ and a kernel size (i.e., the kernel length×the kernel width×the control parameter r).

Lines 5-9 of Table 1 represent that the iterative operations are performed from k=1 to k=K. The steps from line 6 to line 8 are executed in each of the iterative operations.

Line 6 of Table 1 represents that the convolution operation is performed with the grouped quantized weights $W_{l,k}^q$ and the grouped activations $A_{l-1,k}^q$ For example, when k=1, the tensor of the grouped quantized weights $W_{l,k}^q$ includes the kernel length, the kernel width, the control parameter τ and the number of output channels $C_{out}$. The tensor of the grouped activations $A_{l-1,k}^q$ includes the batch size, the length H of the input feature map, the width W of the input feature map and the control parameter τ. Then, the convolution output $A_{l,k}$ (i.e., the MVM output values) can be generated and outputted after the convolution operation.

Line 7 of Table 1 represents that the convolution output $A_{l,k}$ with the floating-point value is quantized into the convolution target bit $b_{AD}$ so as to obtain the quantized convolution output $A_{l,k}^q$. Line 7 of Table 1 simulates the quantization of the analog-to-digital converter 220.

Line 8 of Table 1 represents that the partial-sum operation is performed with the quantized convolution output $A_{l,k}^q$ to add the quantized convolution outputs $A_{l,k}^q$ in all of the iterative operations so as to achieve the purpose of enabling the convolution operation of ReRAM of the present disclosure to be equivalent to a conventional convolution.

Line 10 of Table 1 represents that the output activation $A_l$ is linearly quantized into the activation target bit $b_A$ so as to obtain the quantized output activation $A_l^q$. Line 11 of Table 1 represents that a pooling operation is perform in the deep neural network. The pooling operation is a conventional technique and not described in detail herein. Line 12 of Table 1 represents that the L-layers deep neural network has been performed and ends the forward propagation.

Table 2 lists the error rates with different control parameters r in the cases of the MNIST dataset and the CIFAR-10 dataset. The control parameters τ are used to simulate the number of the turn-on word lines. The number of the turn-on word lines determines the magnitude and the extreme value of the accumulated current on the bit lines. The different numbers of the turn-on word lines have different degrees of influence on the error rates. In one embodiment of the present disclosure, the control parameters τ={1,2,4}. For a convolutional layer with the kernel size of 3×3, the number of the turn-on word lines is equal to {9,18,36}. Due to the existence of the analog-to-digital converter 220, if too much word lines are turned on, the error rates are increased, as shown in experimental results. In the case of $b_W$-$b_A$-$b_{AD}$ being 2-2-4 and the CIFAR-10 dataset, the convolution operation ($\tau$=1) of ReRAM of the present disclosure can be reduced about 0.48% as compared to the conventional convolution ($\tau$=V) instead of grouped convolution. In the case of MNIST dataset, the convolution operation of ReRAM of the present disclosure can be reduced about 0.05% as compared to the conventional convolution.

TABLE 2

| $b_W$ | $b_A$ | $b_{AD}$ | $\tau$ | MNIST (%) | CIFAR-10 (%) |
|---|---|---|---|---|---|
| 2 | 2 | 4 | V | 0.75 | 18.43 |
| 2 | 2 | 4 | 4 | 0.76 | 19.03 |
| 2 | 2 | 4 | 2 | 0.75 | 18.02 |
| 2 | 2 | 4 | 1 | 0.70 | 17.95 |

Figure 8:
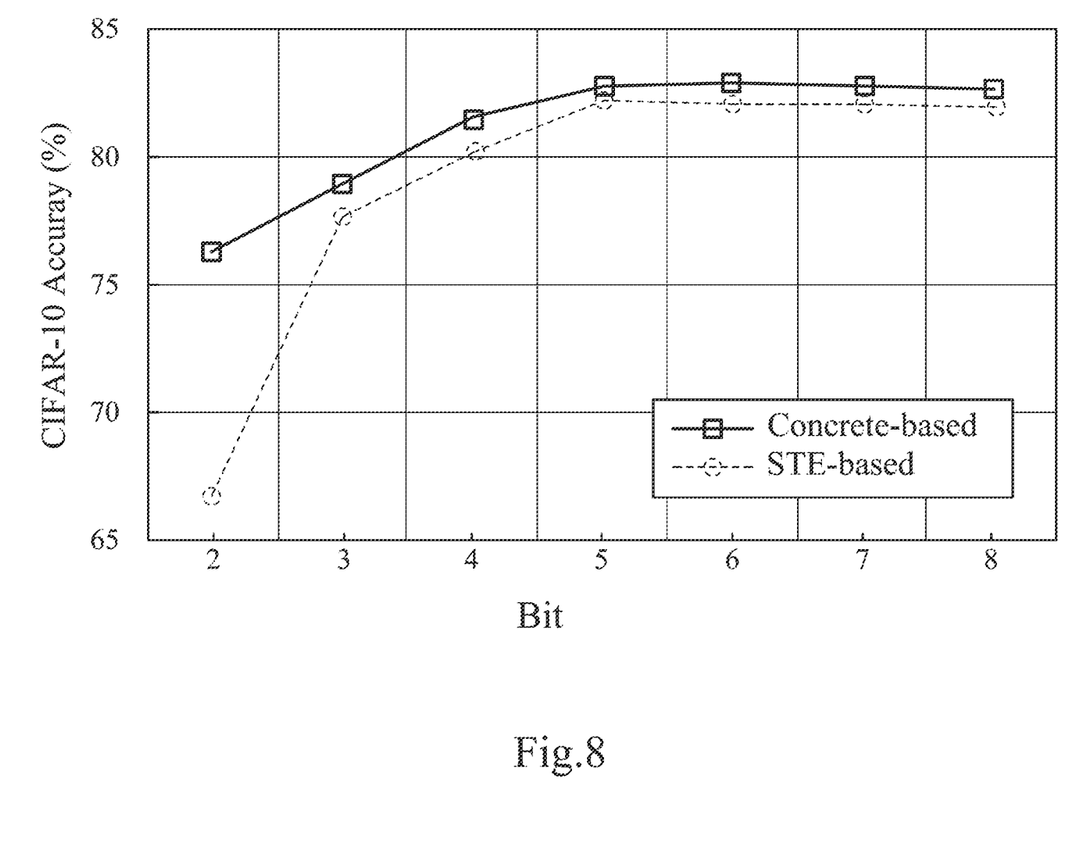
FIG. 8 shows a comparison between a concrete-based quantization and a straight-through-estimator-based quantization in accuracy with different bits of the analog-to-digital convertor.

FIG. 8 shows a comparison between a concrete-based quantization (labeled Concrete-based) and a straight-through-estimator-based quantization (labeled STE-based) in accuracy with different bits of the analog-to-digital convertor 220. The simulation conditions include utilizing the CIFAR-10 dataset and setting the weight target bit $b_W$ and the activation target bit $b_A$ to 2. In the case of different convolution target bits $b_{AD}$, accuracy of the convolution quantizer $Q_{AD}$ based on the concrete-based quantization is higher than accuracy of the convolution quantizer $Q_{AD}$ based on the STE-based quantization in each of the convolution target bits $b_{AD}$. Accuracy of the convolution quantizer $Q_{AD}$ based on the concrete-based quantization has an average improvement of about 0.88% as compared to accuracy of the convolution quantizer $Q_{AD}$ based on the STE-based quantization from 3-bit to 8-bit. More particularly, when the convolution target bits $b_{AD}$ is 2, accuracy of the convolution quantizer $Q_{AD}$ based on the concrete-based quantization has the average improvement of about 9.52%.

Figure 9:
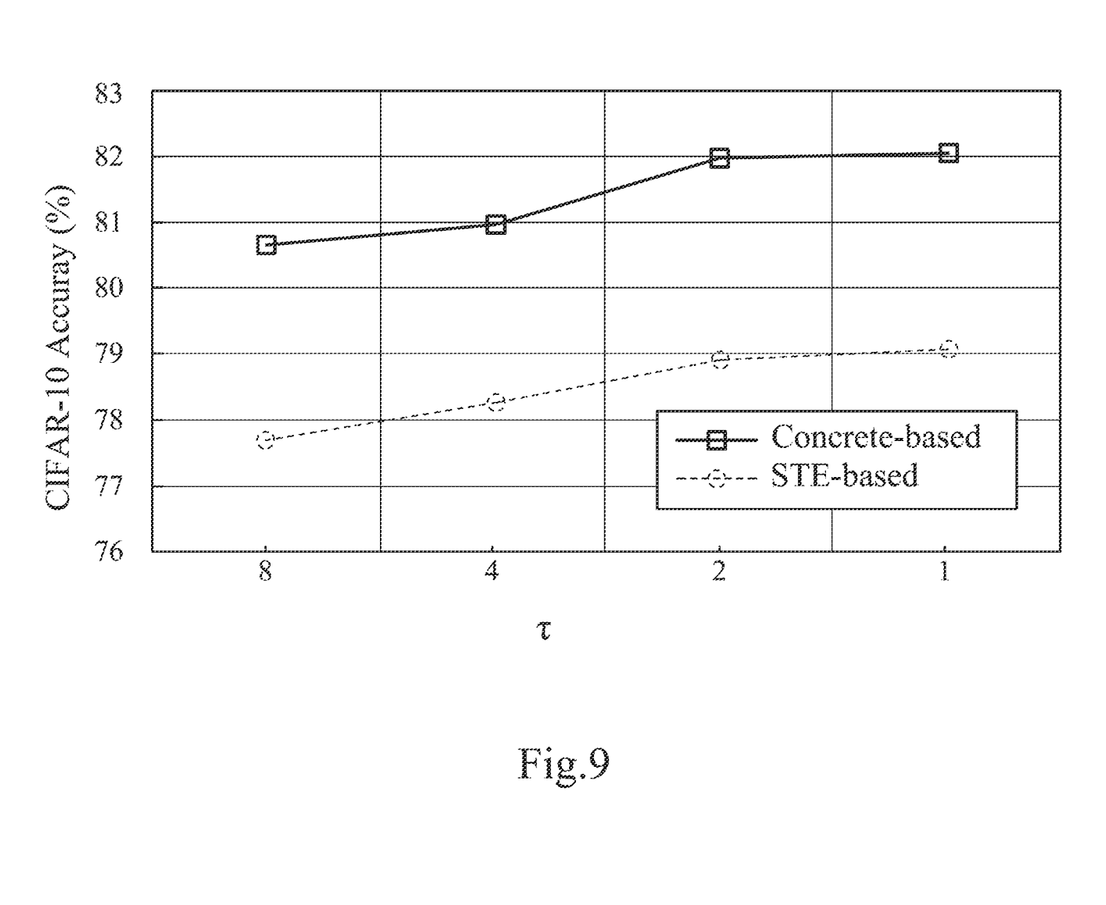
FIG. 9 shows a comparison between the concrete-based quantization and the straight-through-estimator-based quantization in accuracy with different control parameters.

FIG. 9 shows a comparison between the concrete-based quantization and the STE-based quantization in accuracy with different control parameters $\tau$.

The simulation conditions include utilizing the CIFAR-10 dataset and setting the weight target bit $b_W$, the activation target bit $b_A$ and the convolution target bits $b_{AD}$ to 2. In the case of the different control parameters $\tau$, accuracy of the convolution quantizer $Q_{AD}$ based on the concrete-based quantization has an average improvement of about 2.92% as compared to accuracy of the convolution quantizer $Q_{AD}$ based on the STE-based quantization in each of the control parameters $\tau$.

According to the aforementioned embodiments and examples, the advantages of the present disclosure are described as follows.

1. The quantization system based on the hardware of in-memory computing of the present disclosure can consider the limitation of the number of the bits of the analog-to-digital convertor of the hardware. In addition, the quantization system of the present disclosure may train the deep neural network by the categorical distribution and the concrete-based quantization, and the deep neural network can not only be adapted to quantization noise but also be friendly to in-memory computing.
2. The quantization method based on the hardware of in-memory computing of the present disclosure can pre-store the grouped quantized weights to the memory unit and utilize the hardware of in-memory computing to implement the convolution operation, thereby avoiding the problem of a large amount of data transfer between hierarchical memories in the conventional structure. The present disclosure can further reduce power consumption, decrease system latency and improve power efficiency.
3. The present disclosure utilizes a splitting technique and pairwise calculation on the quantized weight and the quantized input activation via the convolution operation of ReRAM and considers the limitation of the number of the bit lines of the memory unit, inputs of the word lines and discretization of the convolution output, so that the present disclosure can obtain better updated weights suitable for the hardware limitations of nvIMC by training the deep neural network.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A quantization method based on a hardware of in-memory computing comprising:

performing a quantization parameter providing step to provide a quantization parameter, wherein the quantization parameter comprises a quantized input activation, a quantized weight and a splitting value;

performing a parameter splitting step to split the quantized weight and the quantized input activation into a plurality of grouped quantized weights and a plurality of grouped activations, respectively, according to the splitting value;

performing a multiply-accumulate step to execute a multiply-accumulate operation with one of the grouped quantized weights and one of the grouped activations, and then generate a convolution output;

performing a convolution quantization step to quantize the convolution output to a quantized convolution output according to a convolution target bit; and performing a convolution merging step to execute a partial-sum operation with the quantized convolution output according to the splitting value, and then generate an output activation;

wherein the quantized input activation has a number of a plurality of input channels, the splitting value is obtained by calculating the number of the input channels and a control parameter, the splitting value is equal to the number of the input channels divided by the control parameter, and the splitting value is a positive integer and is greater than 1 and less than or equal to the number of the input channels;

wherein the hardware of in-memory computing comprises a memory unit and an analog-to-digital converter, the memory unit signally connected to the analog-to-digital converter, the memory unit is a resistive random access memory (ReRAM);

wherein the quantization method based on the hardware of in-memory computing is applied to a quantization system comprising:

a multiply-accumulate unit configured to execute the multiply-accumulate operation with one of the grouped quantized weights and one of the grouped activations so as to generate the convolution output; and an adder configured to execute the partial-sum operation with the quantized convolution output according to the splitting value so as to generate the output activation.

2. The quantization method based on the hardware of in-memory computing of claim 1, further comprising:

performing an iteration executing step to repeatedly execute the multiply-accumulate step, the convolution quantization step and the convolution merging step according to an iteration number, wherein the iteration number is equal to the splitting value.

* * * * *